(12) United States Patent
Na et al.

(10) Patent No.: US 10,255,968 B2
(45) Date of Patent: Apr. 9, 2019

(54) DRAM CORE ARCHITECTURE WITH WIDE I/OS

(71) Applicant: OMNIVISION TECHNOLOGIES, INC., Santa Clara, CA (US)

(72) Inventors: Jongsik Na, San Ramon, CA (US); Taehyung Jung, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/658,047

(22) Filed: Jul. 24, 2017

(65) Prior Publication Data

US 2019/0027209 A1 Jan. 24, 2019

(51) Int. Cl.
G11C 5/06 (2006.01)
G11C 11/4096 (2006.01)
G11C 11/4074 (2006.01)
G11C 11/4094 (2006.01)

(52) U.S. Cl.
CPC ...... G11C 11/4096 (2013.01); G11C 11/4074 (2013.01); G11C 11/4094 (2013.01)

(58) Field of Classification Search
CPC ............ G11C 11/4096; G11C 11/4094; G11C 11/4074
USPC ........................................................... 365/63
See application file for complete search history.

(56) References Cited

U.S. PATENT DOCUMENTS

| 5,636,158 | A | * | 6/1997 | Kato | ...................... | G11C 5/025 |
| | | | | | | 365/205 |
| 2007/0073982 | A1 | * | 3/2007 | Kim | .................... | G11C 7/1027 |
| | | | | | | 711/149 |
| 2008/0279017 | A1 | * | 11/2008 | Shimano | ................ | G11C 5/063 |
| | | | | | | 365/189.06 |

* cited by examiner

*Primary Examiner* — Tha-O H Bui
(74) *Attorney, Agent, or Firm* — Christensen O'Connor Johnson Kindness PLLC

(57) ABSTRACT

A dynamic random-access memory (DRAM) for use with a display includes a plurality of capacitive elements coupled to store one or more bits of data, and a plurality of switches where at least one individual switch in the plurality of switches is coupled to an individual capacitive element in the plurality of capacitive elements. A plurality of input/output (I/O) bit lines including 32 or more input/output bit lines is coupled to read out the data from the plurality of capacitive elements. A plurality of column select lines is coupled to enable readout of the plurality of capacitive elements.

19 Claims, 4 Drawing Sheets

DRAM CORE ARCHITECTURE WITH WIDE I/OS

TECHNICAL FIELD

This disclosure relates generally to dynamic random-access memory (DRAM), and in particular but not exclusively, relates to memory for a display.

BACKGROUND INFORMATION

Dynamic random-access memory (DRAM) may be used with modern electronics due to its low cost and high-capacity. For example the memory in modern personal computers, cameras, GPS devices, servers, networking devices, routers, and digital signal controllers may include DRAM.

DRAM is a type of memory that stores data in individual capacitors. Generally, the capacitors are found within an integrated circuit. The capacitor charge and discharge states may represent a "1" and "0", respectively, and the states may be created by storing either positive or negative charge on the capacitor. One advantage of DRAM is its simple construction, requiring only a single capacitor and transistor to form a bit. Conversely, other types of memory (e.g., SRAM) may require four or more transistors to form a single bit. Thus, DRAM conserves surface area on the surface of a memory chip, and also reduces fabrication costs/time since only a two component cell needs to be formed.

However, there is much room to improve DRAM architectures. For example, DRAM tends to consume more power than other types of memory, and requires frequent refreshing since the architecture of the DRAM chip may leak current. And, in some instances, it may be desirable to read out more data at once than traditional DRAM architectures can provide.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
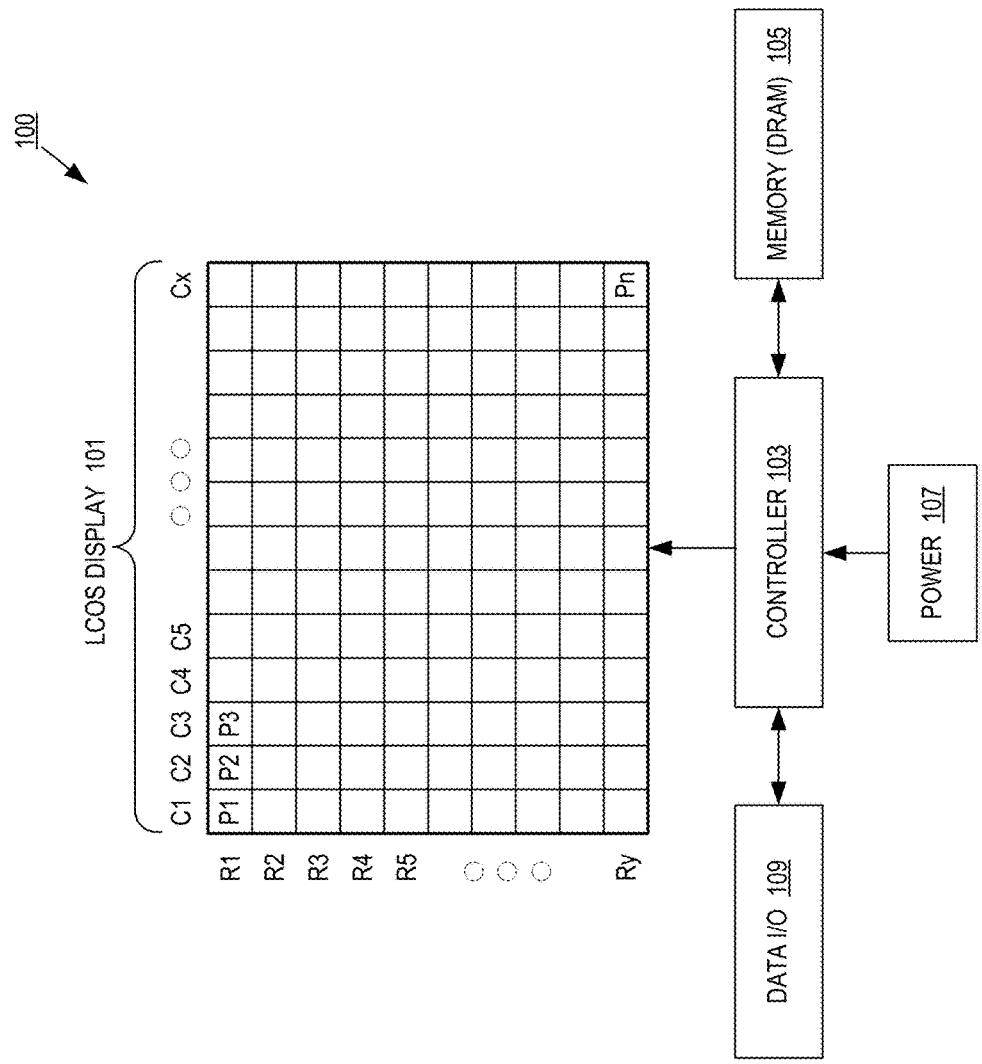
FIG. 1 is a block diagram illustration of a display system, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a DRAM core architecture with wide I/Os are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

As stated above, traditional DRAM architectures may suffer from several drawbacks. For example more inputs/outputs (I/Os) may be needed to increase band width, but there is no room for additional I/O bit lines. Moreover, a large number of I/O bit lines will limit inserting power lines which can be used to avoid IR drop. Further, if there are too many I/O bit lines, the peak surge current for operation could be too large (~1 A). Here, a new DRAM architecture is proposed where the traditional location of I/Os and column selects are swapped in order to enhance memory performance for liquid crystal on silicon (LCOS) displays or other types of displays such high-definition light emitting diode (LED) displays.

Generally, a very wide I/O architecture (e.g., 4×1936=7744 I/O's) is needed for display memory for LCOS and/or other HD displays (e.g., LED or the like). While sometimes static-random access memory (SRAM) is used with these types of displays, here a custom DRAM architecture is used to replace SRAM in these systems. This switch may reduce the area required for memory by 8-10 times.

Figure 2:
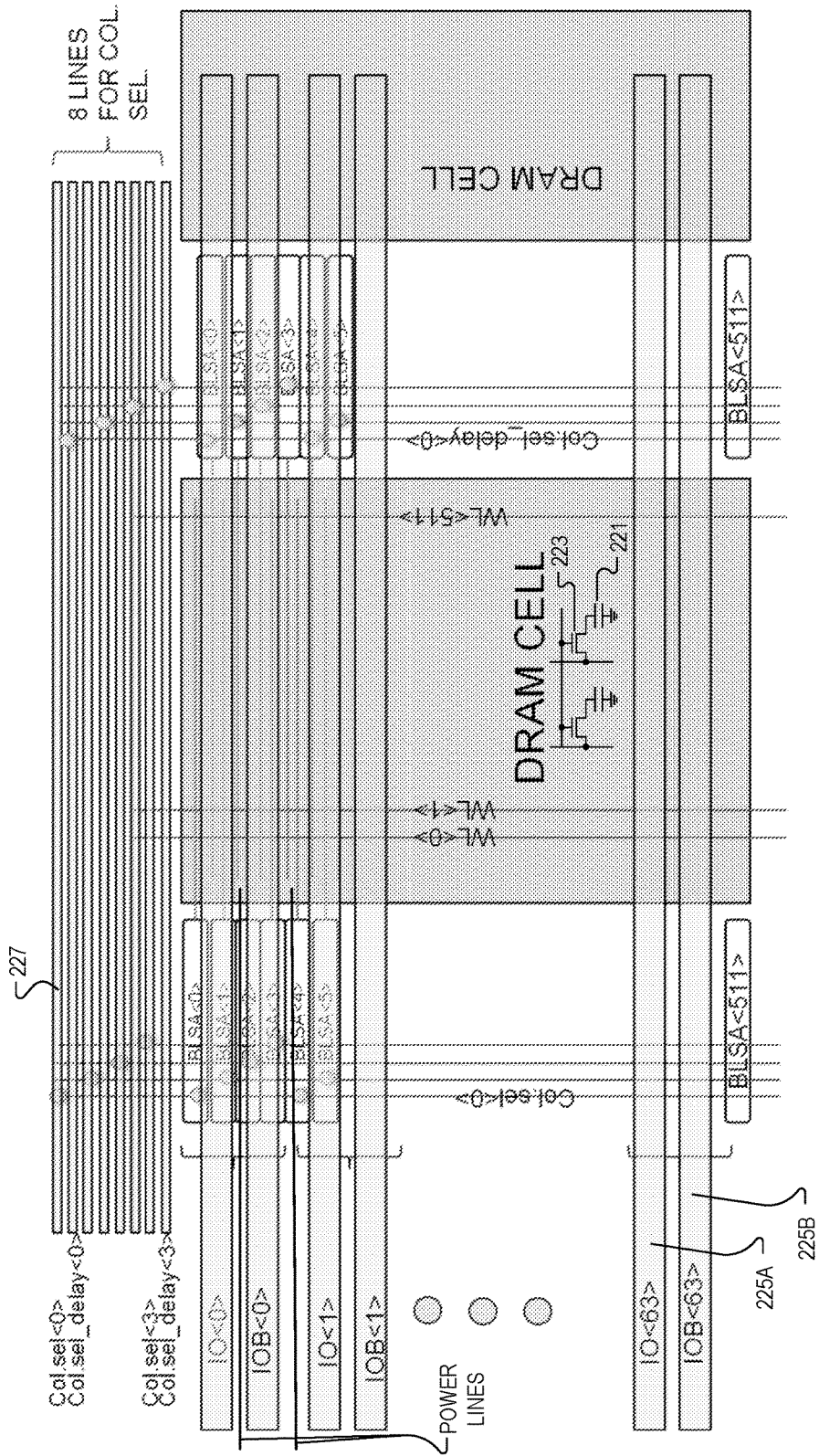
FIG. 2 illustrates one example of DRAM that may be included in the display system of FIG. 1, in accordance with the teachings of the present disclosure.

More specifically, in some examples, an 8 bit I/O DRAM architecture is converted to a 64 bit I/O structure, and the physical locations of I/O traces and column selects are swapped (see e.g., FIG. 2). In other words, in some examples, the 4 I/O bit lines (8 lines, 2 for each I/O) of a traditional DRAM architecture have been replaced with 8 lines for column select; 128 lines of column selects have been replaced with 64 I/O bit lines (128 lines, 2 for each I/O); and power lines are interweaved with the I/O bit lines to prevent crosstalk. The new 64 I/O bit lines use thick horizontal lines (metal layers) and are time-shared by two sets of data which is equivalent with having 128 I/O bit lines. Further, two sets of data are controlled by the column select and the column select delayed lines, for both data read and write operation.

In the same or a different example, 32 I/O bit lines (64 lines, 2 for each I/O) are time-shared by four sets of data—which is the equivalent of 128 (4×32) I/Os—with each I/O bit line (2 lines) interweaved by 32 power lines. Further, wider spaces between each metal trace may be employed (using the unused space from the other 16 freed I/Os), which may result in a lower parasitic capacitance between each I/O pair to increase speed.

In another example, all 7744 wide I/O bit lines are time-shared in three sections for each data cycle to reduce IR drop. Accordingly, the peak current of data transaction is redistributed across three successive data operations. Since the surge of peak current is a noise source in the circuit, it may be useful to distribute current across several data operations.

FIG. 1 is a block diagram illustration of display system 100, in accordance with the teachings of the present disclosure. Display system 100 includes display 101 (which may be an LCOS or other HD display), controller 103, memory 105 (including DRAM), power source 107, and data input/output 109. As shown, all of these components are electrically coupled. In some examples, all of the components may be included in a shared housing. However, one of ordinary skill in the art will appreciate that some components may not be included in a shared housing (e.g., a power converter included in the power source may be part of a wall plug-in).

In some examples, display system 100 may be included in a near-eye application (e.g., viewfinder for a camera or cell phone), or a head mounted display. In some examples, liquid crystal in the LCOS applications may be ferroelectric. In other examples, display system 100 may be included in a projector system such as a picoprojector or the like. One of ordinary skill in the art having the benefit of the present disclosure will understand there are many applications for the LCOS/HD display system 100, and not all of them are listed here in order to avoid obscuring certain aspects of the disclosure.

In some examples, display 101 may be a LCOS microdisplay that uses a liquid crystal layer on top of a silicon backplane to modulate light. CMOS circuitry controls the voltage on reflective electrodes disposed beneath the chip surface, with each electrode controlling a single pixel (e.g., P1-Pn of LCOS display 101). For example, LCOS display 101 may have a HD resolution which includes at least 1920 (column)×1080 (row) plates each with an individually controllable voltage. Thus, having fast memory to control the pixels in the LCOS display is important. A common voltage may be supplied by a transparent electrode (e.g., indium tin oxide on glass) disposed over all of the pixels.

In some examples, display 101 may be a single panel LCOS display (which displays red, green, and blue parts of an image in succession, and relies on the user's eyes to combine the colors), or a three panel LCOS display (which has designated chips for red, green, and blue colors, respectively). Display 101 may also be an LED display with red, green, and blue pixels that are individually controlled by DRAM in memory 105.

As illustrated, controller 103 is coupled to the display 101 to control operation (e.g., as part of a video signal generator) of the individual pixels in the display 101. Controller 103 may be a general purpose controller, or may be specifically designed to control display 101. Moreover, controller 103 may be the component that generates timing of video signals (e.g., blanking interval signal and the horizontal/vertical sync signals). Controller 103 is coupled to memory 109 (which will be described in greater detail in connection with discussion of FIG. 2), and may receive instructions from memory 109 including how to control the pixels in display 101. In other words, controller 103 may be coupled to, or include logic, that when executed by controller 103 causes controller 103 to perform operations including controlling what is shown on display 101.

Controller 103 is coupled to power source 107 which may be used to power all components in display system 100. Power source 107 may include power storage, for example a battery, capacitive storage device, or the like. In some examples, stored power may be useful in applications where display system 100 is included in a small device such as a head mounted display or a pico projector. In some examples, power source 107 may include a power converter, such as a switched-mode power supply or the like, to convert an AC input into a DC output and/or reduce the voltage supplied to controller 103. In some examples, power source 107 may include an electrical input such as a direct plug in (e.g., micro USB or the like) or may include other ways of receiving power such as inductive charging (e.g., inductive charging wire loop) or the like.

Controller 103 is also coupled to data input/output (I/O) 109—not to be confused with I/O bit lines 225A/225B in DRAM 205 discussed below. In one example this may include a direct plug in (e.g., USB, Micro USB, Firewire, or the like) or may include wireless data input (e.g., Bluetooth, RFID, etc.) to communicate with display system 100. In other examples this may include an IR receiver (for a remote control). Alternatively or additionally, data I/O 109 may include tactile inputs (e.g., from a keyboard or mouse), or vocal inputs (e.g., from a microphone). One of ordinary skill in the art having the benefit of the present disclosure will understand that data I/O 109 may include any number of components depending on the display system being built.

FIG. 2 illustrates one example of DRAM 205 that may be included in the display system 100 of FIG. 1, in accordance with the teachings of the present disclosure. As shown plurality of capacitive elements 221 (e.g., capacitors formed in a semiconductor material, plate capacitors, or the like) are coupled to store one or more bits of data (e.g., electrical charge on the capacitive elements 221). In some examples, capacitive elements 221 may contain more than a single bit of memory by storing a wide voltage range, where different quantities of stored charge correspond to a different number of bits. Plurality of switches 223 is coupled to individual capacitive elements 221 in the plurality of capacitive elements 221, and coupled to column selects and plurality of input/output (I/O) bit lines. Plurality of I/O bit lines 225A/225B, are coupled to read out the data from plurality of capacitive elements 221. In some examples, there may be 32 or more I/O bit lines 225A/225B, for example as depicted there are 64 I/O bit lines 225A/225B (e.g., IO<0>-IO<63>). DRAM 205 also depicts a plurality of column select lines 227 coupled to enable readout of plurality of capacitive elements 221.

In some examples, individual I/O bit lines 225A/225B in plurality of I/O bit lines 225A/225B have a width of at least 100 μm (more specifically 108 μm). In the depicted example, I/O bit lines 225A/225B may be part of the top metal layer (e.g., the metal layer closest to the surface of the chip exposed to air or packaging). Also, individual I/O bit lines 225A/225B include a first bit line segment 225A and a second bit line segment 225B. First bit line segment 225A is coupled to transfer the data out of capacitive elements 221 with a first electrical signal, and the second bit line segment 225B is coupled to transfer the data with a second electrical signal. The second electrical signal is complementary to the first electrical signal. The complementary signal may be the inverse (e.g., first bit line segment 225A may transmit a logic high signal, while second bit line segment 225B may transmit a logic-low signal).

As depicted, DRAM 205 includes plurality of power lines (e.g., lines between IO's) to supply power to DRAM 205, and the power lines are disposed between individual I/O bit lines 225A/225B in plurality of I/O bit lines 225A/225B to prevent electrical crosstalk between the individual I/O bit lines 225A/225B. Similar to I/O bit lines 225A/225B, plurality of power lines may be part of the top metal layer. Moreover, power lines may be as wide as I/O bit lines 225A/225B (e.g., 100 µm or more).

As shown plurality of column select lines 227 includes 4 or more column select lines (divided into two segments: column select and column select delay). In some examples, there may be fewer than 32 column selects. The DRAM architecture depicted may have a 40 ns cycle resulting in 194 GHz operation (40 ns cycle×7746 IO=194 GHz).

Figure 3:
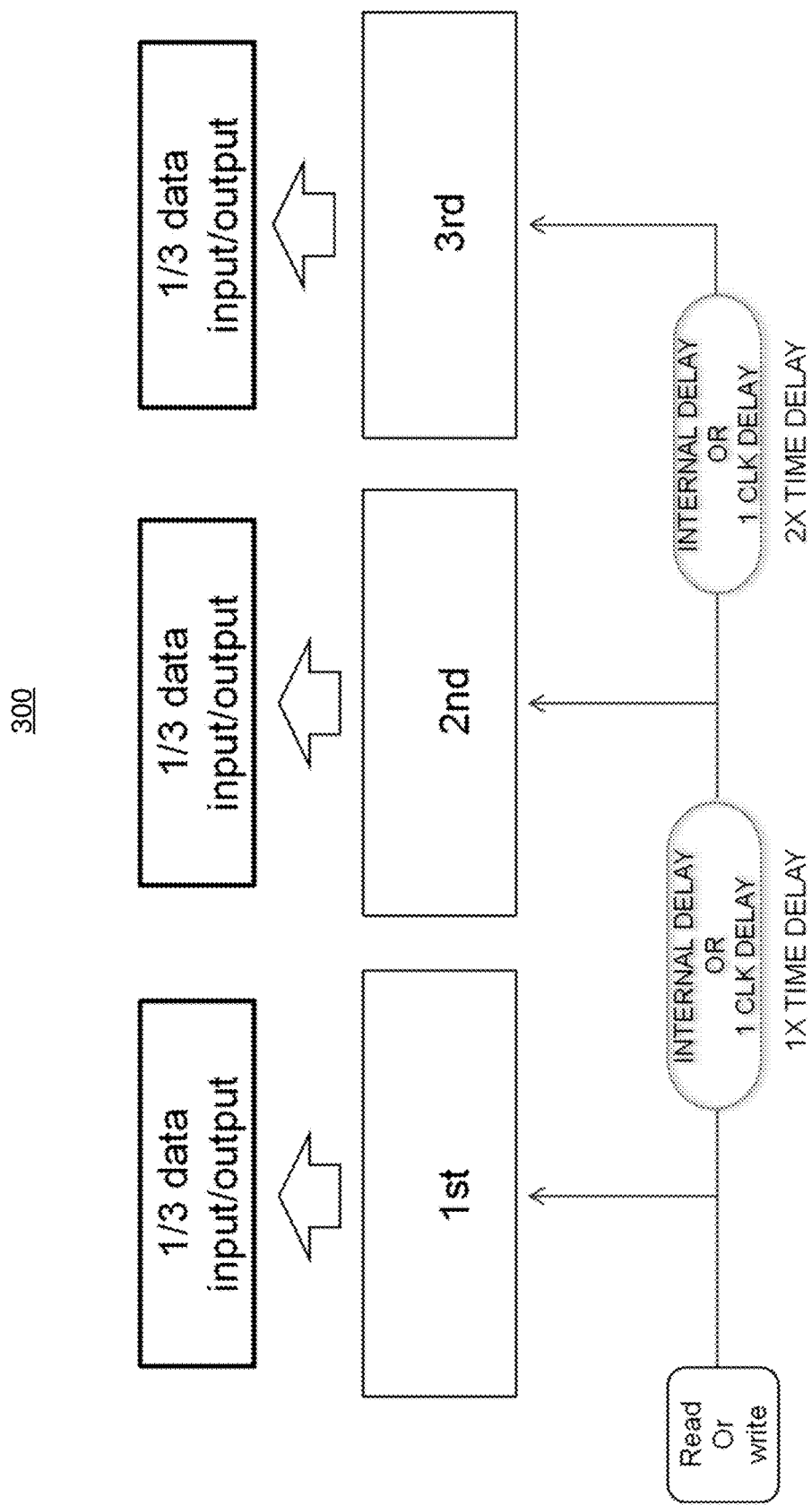
FIG. 3 is a flowchart illustrating distributed readout from DRAM, in accordance with the teachings of the present disclosure.

FIG. 3 is a flowchart 300 illustrating distributed readout from DRAM, in accordance with an embodiment of the disclosure. One of ordinary skill in the art having the present disclosure will appreciate that flowchart 300 may show processes of memory 105 in FIG. 1 and/or DRAM 205 in FIG. 2. As illustrated, data is readout from the plurality of capacitive elements to the plurality of input/output (I/O) bit lines, and readout is distributed across three separate read operations in succession to read out all of the data in the DRAM bits. This distribution of data readout allows for redistribution of peak current—which may reduce noise in DRAM—in the successive data operations. For example, if data is read out in one operation, there may be high peak current which results in a lot of noise. However, if data readout is distributed across three successive operations, there is a lower peak current and less noise. Noise may be due to inductive/capacitive current forming in other pieces of DRAM device architecture during readout. It is appreciated that in other examples, data may be read out in more than three operations, in accordance with the teachings of the present disclosure. Additionally, in some examples, writing data to the DRAM bits may also occur in at least three successive operations to reduce peak current when writing to memory.

Figure 4:
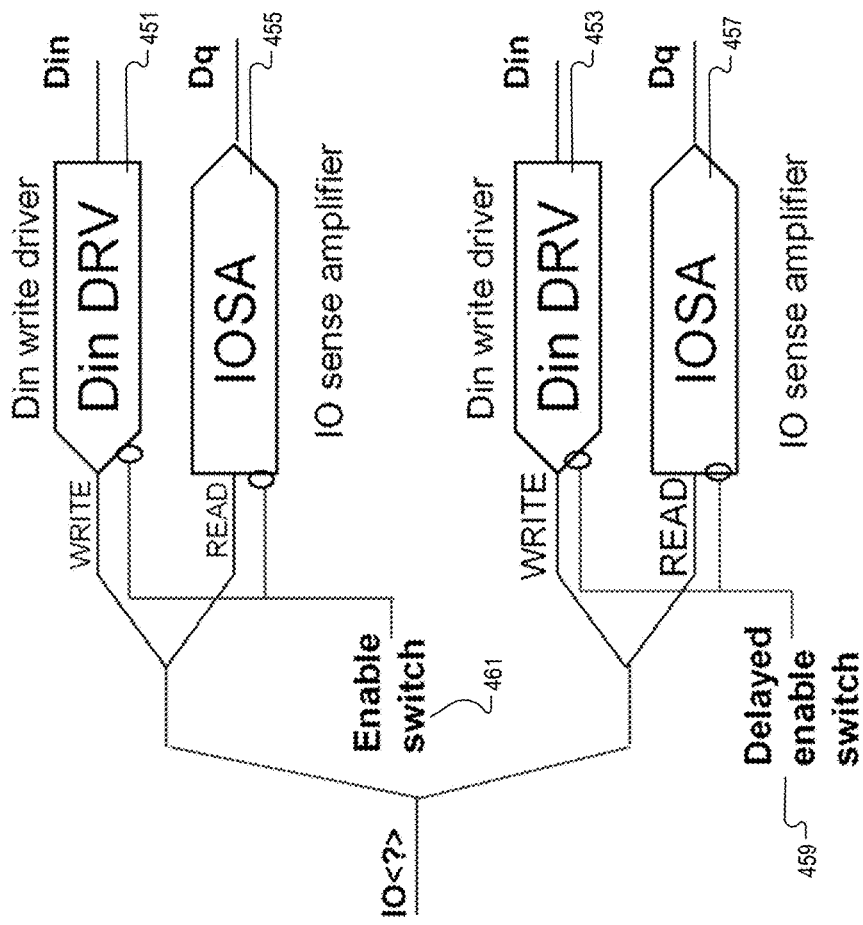
FIG. 4 illustrates a portion of DRAM architecture that may be used to form the DRAM of FIG. 2, in accordance with the teachings of the present disclosure.

FIG. 4 illustrates a portion of DRAM architecture that may be used to form the DRAM of FIG. 2, in accordance with the teachings of the present disclosure. As shown, I/O bit lines are shared in order to reduce the number of lines from 128 to 64. The depicted I/O bit line is coupled to first write driver 451 and second write driver 453. The depicted I/O bit line is also coupled to first sense amplifier 455 and second sense amplifier 457. First write driver 451 and first sense amplifier 455 are coupled to enable switch 461. Second write driver 453 and second sense amplifier 457 are coupled to delayed enable switch 459. By time-sharing I/O lines the number of I/Os can be cut in half (e.g., from 128 to 64), in accordance with the teachings of the present disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A dynamic random-access memory (DRAM) for use with a display, including:

a plurality of capacitive elements coupled to store one or more bits of data;

a plurality of switches, wherein at least one individual switch in the plurality of switches is coupled to an individual capacitive element in the plurality of capacitive elements;

a plurality of input/output (I/O) bit lines including 32 or more input/output bit lines coupled to read out the data from the plurality of capacitive elements;

a plurality of column select lines coupled to enable readout of the plurality of capacitive elements; and a plurality of power lines to supply power to the DRAM, wherein the power lines are disposed between individual I/O bit lines in the plurality of I/O bit lines and positioned to prevent electrical crosstalk between the individual I/O bit lines.

2. The DRAM of claim 1, wherein the individual I/O bit lines in the plurality of input/output (I/O) bit lines have a width of at least 100 µm.

3. The DRAM of claim 2, wherein the individual I/O bit lines are time shared to transfer the data and include a first bit line segment and a second bit line segment, and wherein the first bit line segment is coupled to transfer the data with a first electrical signal and the second bit line segment is coupled to transfer the data with a second electrical signal, wherein the second electrical signal is activated after the first electrical signal and is complementary to the first electrical signal.

4. The DRAM of claim 1, wherein the plurality of I/O bit lines includes at least 64 bit lines.

5. The DRAM of claim 4, wherein the individual I/O bit lines are time shared to transfer the data and include a first bit line segment and a second bit line segment, and wherein the first bit line segment is coupled to transfer the data with a first electrical signal and the second bit line segment is coupled to transfer the data with a second electrical signal, wherein the second electrical signal is activated after the first electrical signal and is complementary to the first electrical signal.

6. The DRAM of claim 1, wherein data readout from the plurality of capacitive elements to the plurality of input/output (I/O) bit lines is distributed across three separate and successive read operations when all of the data in the DRAM is read.

7. The DRAM of claim 1, wherein the plurality of column select lines includes 4 or more column select lines but fewer than 32 column select lines.

8. The DRAM of claim 1, wherein the display has a resolution of at least 1920×1080 pixels and is either a LCOS or LED display.

9. A display system, comprising:

a display including a plurality of pixels;

a controller coupled to the display to control the plurality of pixels and display an image; and a dynamic random-access memory (DRAM) coupled to the controller to output data to the controller, wherein the data includes instructions to control the plurality of pixels and display the image, the DRAM including:

a plurality of capacitive elements coupled to store one or more bits of data;

a plurality of switches, wherein at least one individual switch in the plurality of switches is coupled to an individual capacitive element in the plurality of capacitive elements; and a plurality of input/output (I/O) bit lines including 32 or more input/output bit lines coupled to read out the data from the plurality of capacitive elements; and a plurality of power lines to supply power to the DRAM, wherein the power lines are disposed between individual I/O bit lines in the plurality of I/O bit lines and positioned to prevent electrical crosstalk between the individual I/O bit lines.

10. The display system of claim 9, wherein the individual I/O bit lines in the plurality of input/output (I/O) bit lines have a width of at least 100 μm.

11. The display system of claim 10, wherein the individual I/O bit lines are time shared to transfer the data and include a first bit line segment and a second bit line segment, and wherein the first bit line segment is coupled to transfer the data with a first electrical signal and the second bit line segment is coupled to transfer the data with a second electrical signal, wherein the second electrical signal is activated after the first electrical signal and is complementary to the first electrical signal.

12. The display system of claim 9, wherein the plurality of I/O bit lines includes at least 64 bit lines.

13. The display system of claim 12, wherein the individual I/O bit lines are time shared to transfer the data and include a first bit line segment and a second bit line segment, and wherein the first bit line segment is coupled to transfer the data with a first electrical signal and the second bit line segment is coupled to transfer the data with a second electrical signal, wherein the second electrical signal is activated after the first electrical signal and is complementary to the first electrical signal.

14. The display system of claim 9, wherein data readout from the plurality of capacitive elements to the plurality of input/output (I/O) bit lines is distributed across three separate and successive read operations when all of the data in the DRAM is read.

15. The display system of claim 9, further comprising a plurality of column select lines including 4 or more column select lines but fewer than 32 column select lines.

16. The display system of claim 9, wherein the display has a resolution of at least 1920×1080 pixels.

17. The display system of claim 9, further comprising a power source coupled the display system to provide DC power to the controller and the display.

18. The display system of claim 9, wherein there is no SRAM coupled to the display.

19. A dynamic random-access memory (DRAM) for use with a display, including:
    a plurality of capacitive elements coupled to store one or more bits of data;
    a plurality of switches, wherein at least one individual switch in the plurality of switches is coupled to an individual capacitive element in the plurality of capacitive elements;
    a plurality of input/output (I/O) bit lines including 32 or more input/output bit lines coupled to read out the data from the plurality of capacitive elements;
    a plurality of column select lines coupled to enable readout of the plurality of capacitive elements; and
    a plurality of power lines to supply power to the DRAM, wherein the power lines are disposed between individual I/O bit lines in the plurality of I/O bit lines to prevent electrical crosstalk between the individual I/O bit lines, wherein the individual I/O bit lines are time shared to transfer the data and include a first bit line segment and a second bit line segment, and wherein the first bit line segment is coupled to transfer the data with a first electrical signal and the second bit line segment is coupled to transfer the data with a second electrical signal, wherein the second electrical signal is activated after the first electrical signal and is complementary to the first electrical signal.

* * * * *